United States Patent
Tanida et al.

(10) Patent No.: US 8,426,977 B2
(45) Date of Patent: Apr. 23, 2013

(54) SEMICONDUCTOR APPARATUS, MANUFACTURING METHOD OF SEMICONDUCTOR APPARATUS, AND CAMERA MODULE

(75) Inventors: Kazumasa Tanida, Kawasaki (JP);
Hideko Mukaida, Kunitachi (JP);
Susumu Harada, Yokohama (JP);
Chiaki Takubo, Sumida-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 746 days.

(21) Appl. No.: 12/539,037

(22) Filed: Aug. 11, 2009

(65) Prior Publication Data
US 2010/0038741 A1 Feb. 18, 2010

(30) Foreign Application Priority Data

Aug. 12, 2008 (JP) ................. 2008-207830

(51) Int. Cl.
*H01L 23/48* (2006.01)
(52) U.S. Cl.
USPC ............ 257/774; 257/E23.011; 257/E21.597; 438/667
(58) Field of Classification Search .................. 257/774, 257/E23.011, E23.145, E21.597; 438/667
See application file for complete search history.

(56) References Cited

U.S. PATENT DOCUMENTS

| | | | |
|---|---|---|---|
| 7,180,149 B2 | 2/2007 | Yamamoto et al. | |
| 2006/0087042 A1* | 4/2006 | Kameyama et al. | 257/774 |
| 2008/0303170 A1 | 12/2008 | Tanida et al. | |
| 2009/0057844 A1 | 3/2009 | Tanida et al. | |
| 2009/0096051 A1 | 4/2009 | Sugiyama et al. | |

FOREIGN PATENT DOCUMENTS

| | | |
|---|---|---|
| EP | 1662564 | 5/2006 |
| JP | 2005-286028 | 10/2005 |
| JP | 2005-294320 | 10/2005 |
| JP | 2006-269968 | 10/2006 |
| JP | 2009-094230 | 4/2009 |
| WO | 2005022631 | 3/2005 |
| WO | 2009084700 | 7/2009 |

OTHER PUBLICATIONS

Japanese Office Action dated Feb. 22, 2011 corresponding to U.S. Appl. No. 12/539,037, filed Aug. 11, 2009.

* cited by examiner

*Primary Examiner* — Calvin Lee
*Assistant Examiner* — Scott Stowe
(74) *Attorney, Agent, or Firm* — Turocy & Watson, LLP

(57) ABSTRACT

A semiconductor apparatus includes, a semiconductor substrate having first and second main surfaces and a through hole connecting the first and second main surfaces; a first insulation layer arranged on the first main surface, and having an opening corresponding to the through hole; a first conductive layer arranged on the first insulation layer, and covering the through hole; a second insulation layer arranged on an inner wall of the through hole and the second surface; a second conductive layer arranged in the through hole and on the second insulation layer, the second conductive layer contacting the first conductive layer; and a filling member arranged on the second conductive layer in the through hole, and having a gap between the second conductive layer on the first main surface side.

12 Claims, 4 Drawing Sheets

SEMICONDUCTOR APPARATUS, MANUFACTURING METHOD OF SEMICONDUCTOR APPARATUS, AND CAMERA MODULE

CROSS REFERENCE TO RELATED APPLICATIONS

This application is based upon and claims the benefit of priority from the prior Japanese Patent Application No. 2008-207830 filed on Aug. 12, 2008; the entire contents of which are incorporated herein by reference.

BACKGROUND OF THE INVENTION

1. Field of the Invention

The present invention is related to a semiconductor apparatus, a manufacturing method of the semiconductor apparatus, and a camera module.

2. Description of the Related Art

A Wafer Level Chip Scale Package (WL-CSP) of an image sensor chip is proposed for downsizing and weight-saving of an image sensor package using a semiconductor integrated circuit and used for a camera module and the like. The WL-CSP is manufactured as follows. Specifically, a first conductive layer is formed on a main surface of a semiconductor chip (a semiconductor wafer). A through hole is formed in the wafer. A second conductive layer is formed in the through hole. A third conductive layer is formed on the back surface side of the wafer. A metal bump is arranged on the third conductive layer.

For example, WO 2005/022631 A1 discloses a semiconductor apparatus which can be used as an image sensor package. A through hole which pass through a semiconductor substrate (a semiconductor wafer) made by silicon in the direction of the thickness is formed. After that, an insulation film is formed on both of the inner wall surface of the through hole and the back surface of the semiconductor substrate (semiconductor wafer). A through conductive layer is formed in the through hole. And, via the conductive layer, front side conductive layer formed on the front side of the semiconductor substrate (semiconductor wafer) and an external terminal formed on the back side of the semiconductor substrate are electrically connected.

However, the semiconductor apparatus manufactured in such way has the possibility of low electric reliability. That is, a heat load during reflow mounting or temperature cycles causes a short circuit of the semiconductor apparatus by fractures of a back side insulation film or a front side insulation film, and a poor connection brought by increasing resistances by fracture of a front side conductive film.

BRIEF SUMMARY OF THE INVENTION

A semiconductor apparatus of an aspect of the present invention includes, a semiconductor substrate having first and second main surfaces and a through hole connecting the first and second main surfaces; a first insulation layer arranged on the first main surface, and having an opening corresponding to the through hole; a first conductive layer arranged on the first insulation layer, and covering the through hole; a second insulation layer arranged on an inner wall of the through hole and the second surface; a second conductive layer arranged in the through hole and on the second insulation layer, the second conductive layer contacting the first conductive layer; and a filling member arranged on the second conductive layer in the through hole, and having a gap between the second conductive layer on the first main surface side.

A manufacturing method of a semiconductor apparatus of an aspect of the present invention includes, forming a first insulation layer on a first main surface of a semiconductor substrate; forming a first conductive layer on the first insulation layer; forming a through hole from a second main surface of the semiconductor substrate opposite to the first main surface towards the first main surface to expose the first insulation layer; forming a second insulation layer on an inner wall of the through hole and on the second surface; removing a part of the first and second insulation layers to expose the first conductive layer in the through hole; forming a second conductive layer in the through hole and on the second insulation layer, the second conductive layer contacting the first conductive layer; and forming a filling member on the second conductive layer in the through hole, the filling member having a gap between the second conductive layer on the first main surface side.

DETAILED DESCRIPTION OF THE INVENTION

An embodiment of the present invention will be explained as follows.

(A Semiconductor Apparatus)

Figure 1:
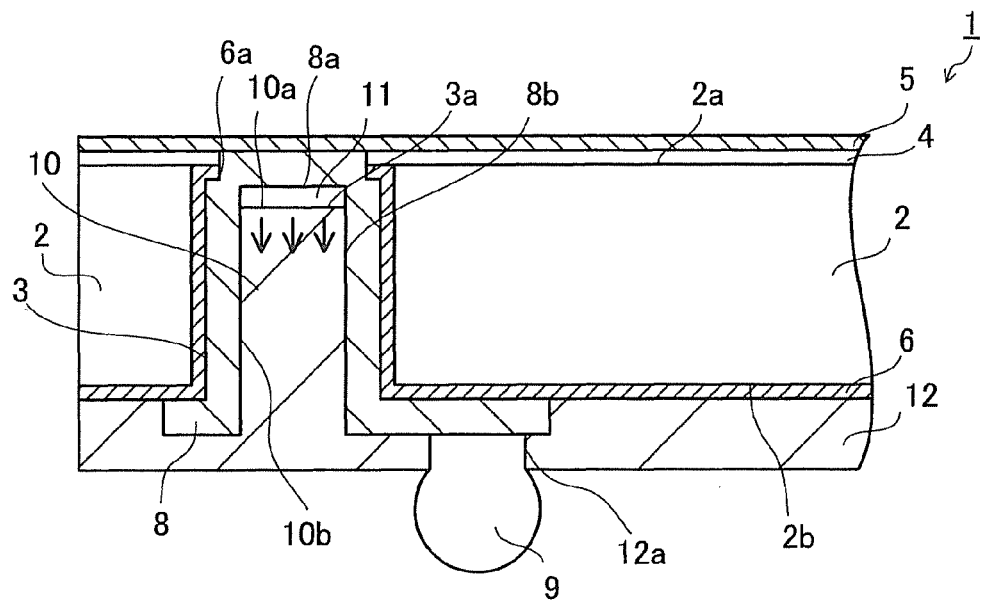
FIG. 1 is a cross section showing a configuration of a semiconductor apparatus of the first embodiment.

FIG. 1 is a cross section showing a configuration of a semiconductor apparatus of the first embodiment.

As shown in FIG. 1, the semiconductor apparatus 1 of the embodiment has a semiconductor substrate 2 made of silicon or the like. The semiconductor substrate 2 has a first main surface 2a and a second main surface 2b which are opposed to each other. The first main surface 2a constructs an element area formation surface. And, on the semiconductor substrate 2, a through hole 3 is formed in the direction of the thickness. The first main surface 2a and second main surface 2b are connected through the through hole 3.

On the first main surface 2a of the semiconductor substrate 2, a first insulation layer 4 is formed, and the first insulation layer 4 has an opening on the first main surface 2a side of the through hole 3. On the first insulation layer 4, a first conductive layer 5 is formed. The first conductive layer 5 covers the opening of the through hole 3 on the main surface 2a side of the semiconductor substrate 2.

The second insulation layer 6 is continuously arranged from on the inner wall of the through hole 3 to on the second main surface 2b of the semiconductor substrate 2. The second conductive layer 8, which is contacted to the first conductive layer 5, is continuously formed on the second insulation layer 6 from the inner wall of the through hole 3 to the second main surface 2b of the semiconductor substrate 2. The second insulation layer 6 and the second conductive layer 8 do not completely fill the through hole 3, and has a conformal shape against the shape of the through hole 3. And, the second insulation layer 6 and the second conductive layer 8 have almost constant thickness in the area from in the inner surface of the through hole 3 to above the second main surface 2b of the semiconductor substrate 2.

Via the second insulation layer 6 and the second conductive layer 8a, the filling member 10 fills the through hole 3. In the through hole 3, a gap 11 is arranged at the edge of the filling member 10 on the first main surface 2a side of the semiconductor substrate 2.

On the second main surface 2b of the semiconductor substrate 2, the protection layer 12 is arranged to cover the second insulation layer 6 and the second conductive layer 8. In an opening 12a of the protection layer 12, an external terminal 9 is arranged to electrically contact to the second conductive layer 8.

Besides, in the embodiment, the filling member 10 acts as the protection layer 12, as the filling member 10 is constructed by insulation material, and is arranged from in the through hole 3 to on the second main surface 2a of the semiconductor substrate 2. That is, when filling member 10 is formed, the filling member 10 is constructed by an insulation material. Thus, the filling member 10 and protection layer 12 can be formed by one operation.

The first insulation layer 4 can be constructed by, for example, silicon oxide ($SiO_2$), silicon nitride ($SiN_x$), SiOF (Fluorine-doped $SiO_2$), porous SiOC (Carbon-doped $SiO_2$) and so on. The second insulation layer 6 can be constructed by, for example, silicon oxide, silicon nitride, polyimide resin, BCB (benzo-cyclobutene) resin, parylene resin, epoxy resin and soon.

The first conductive layer 5 and the second conductive layer 8 can be constructed by, for example, high resistance metal material (Ti, TiN, TiW, Ni, Cr, TaN, or COWP and so on) or low resistance metal material (Al, Al—Cu, Al—Si—Cu, Cu, Au, Ag and so on) and so on. The first conductive layer 5 and second conductive layer 8 can be formed from these materials as a single layer or as multiple layers laminating several layers.

The protection layer 12 can be constructed by thermosetting resin, for example, polyimide resin, epoxy resin, acrylic resin, or solder resist material. In this case, the gap 11 can be formed while, for example, the filling member 10 cures and shrinks. That is, at first, filling member 10 is a melting state, and fills the through hole 3, and contacts the bottom 8a of the second conductive layer 8 located on the first main surface 2a side. After that, the filling member 10 thermally shrinks at the direction shown by the arrow in the Figure during the heat curing procedure to have a clearance from the bottom 8a of the second conductive layer 8. As a result of this, the gap as mentioned above is formed.

Besides, the shape of the bottom 10a of the filling member 10 is generally corresponding to the shape of the bottom 8a of the second conductive layer 8, because the filling member 10 uniformly shrinks at the direction of the arrow.

And, when the gap 11 is formed, the second conductive layer 8 can be constructed from, for example, Cu and so on which are conductive material having a good mold-releasing properties, or good repellent material, for example, polytetrafluoroethylene and so on can be applied on the bottom 8a of the second conductive layer 8. As a result of this, the gap 11 can be formed, for example, by applying downward mechanical force to the filling member 10 without the above-mentioned thermal shrinkage during the heat curing.

Besides, both of the above-mentioned thermal shrinkage and the mechanical method using Cu or polytetrafluoroethylene and so on can be used together.

In the embodiment, the filling member 10 does not directly contact to the bottom 8a of the second conductive layer 8 as the gap 11 is formed in through hole 3 in advance, even if filling member 10 shrinks during reflow mounting or heat cycle. Thus, even if the filling member 10 shrinks, (tensile) stresses, which is occurred by shrink of the filling member 10, does not act on the first insulation film 4 and the second insulation film 6 and on the first conductive layer 5 and the second conductive layer 8.

As a result, an electrical short circuit of the semiconductor apparatus 1 caused by the fracture of the first insulation film 4 and/or the second insulation film 6 does not occurred. And, the problem of increasing resistance of semiconductor apparatus 1 caused by a poor connection and so on by fractures of the first conductive layer 5 and/or the second conductive layer 8 can be avoided. Thus, electrical reliabilities of the semiconductor apparatus 1 can be improved.

Besides, as shown in FIG. 1, it is preferred that gap 11 is constructed from the total space formed by the bottom 10a of the filling member 10 and the bottom 8a of the second conductive layer 8. That is, it is preferred that the bottom 10a of the filling member 10 absolutely does not contact to the bottom 8a of the second conductive layer 8. Hereby, the above-mentioned merit can be effectively realized.

However, even if the gap 11 is formed and the bottom 10a of the filling member 10 and a part of the bottom 8a of the second conductive layer 8 does not contact each other, the above-mentioned merit can be realized. However, comparing with the case that the bottom 10a of the filling member 10 absolutely does not contact to the bottom 8a of the second conductive layer 8, the degree of the above-mentioned merit will decrease.

Moreover, the gap 11 may be formed, not only between the bottom 10a of the filling member 10 and the bottom 8a of the second conductive layer 8, but also between the side 10b of the filling member 10 and the side 8b of the second conductive layer 8.

On the other hand, in a conventional semiconductor apparatus, a gap is not formed in through hole, filling member directly contact to the bottom of the second conductive layer. Thus, if filling member shrinks during reflow mounting or heat cycle, (tensile) stresses, which is occurred by shrink of the filling member, act on the first insulation film and the second insulation film and on the first conductive layer and the second conductive layer.

As a result, the first insulation film and/or the second insulation film may fracture, and the semiconductor apparatus may electrically short-circuit. Furthermore, the first conductive layer and/or the second conductive layer may fracture, it brings the problem of increasing resistance of the semiconductor apparatus by a poor connection and so on. Thus, improvement of electrical reliabilities of the semiconductor apparatus is difficult.

On the other hand, in the semiconductor apparatus 1 of the embodiment, the gap 11 is arranged in the through hole 3 so that the filling member 10 does not directly contact to the bottom 8a of the second conductive layer 8. Thus, comparing with the conventional semiconductor apparatus, problems of electrical short circuit and increasing resistance and so on can be avoided, and electrical reliabilities of semiconductor apparatus 1 can be improved.

Figure 2:
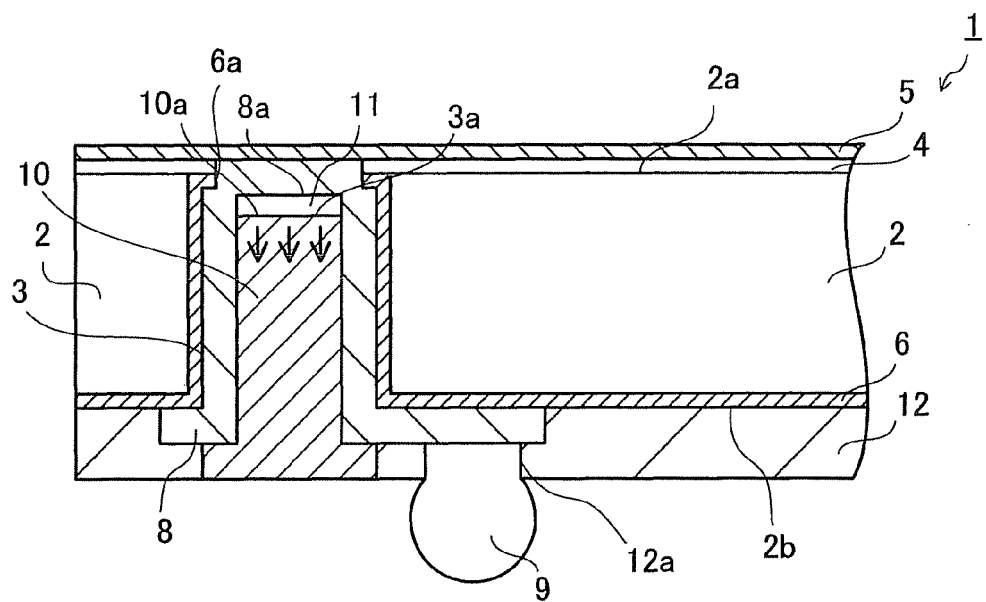
FIG. 2 is a cross section showing a configuration of a semiconductor apparatus of the second embodiment.

FIG. 2 is a cross section showing a construction of the semiconductor apparatus of the second embodiment. In the semiconductor apparatus 1 of the second embodiment, the filling member 10 is constructed from a conductive material, for example, resin including conductive fillers or solder material. As a result, the resistance of conductive pass from the first conductive layer 5 to the external terminal 9 via the through hole 3 can decrease.

Besides, in the embodiment, electrically contacts between the second conductive layer 8a on the second main surface 2b of the semiconductor substrate 2 and the external terminal 9 is prevented so that the external terminal 9 does not electrically short circuit. Thus, the external terminal 9 is formed in isolation with the protection layer 12.

Besides, in the embodiment, the gap 11 is arranged in the through hole 3 so that the filling member 10 does not directly contact to the bottom 8a of the second conductive layer 8. Thus, comparing with the conventional semiconductor apparatus, problems of electrical short circuits and increasing resistance and so on can be avoided, and electrical reliabilities of semiconductor apparatus 1 can be improved.

Next, a manufacturing method of the semiconductor apparatus of the embodiment will be explained. In the embodiment, a manufacturing method of the semiconductor apparatus 1 as shown in FIG. 1 will be explained. FIG. 3A to FIG. 3F are cross sections showing each procedure of the manufacturing method of the semiconductor apparatus of the embodiment.

Figure 3A:
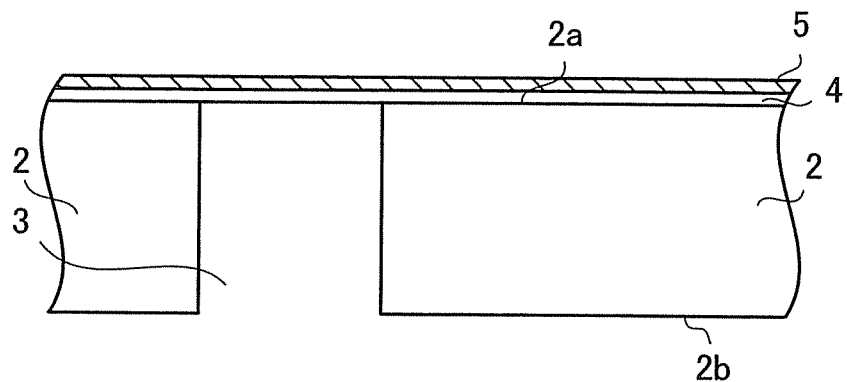
FIG. 3A to FIG. 3F are cross sections showing each processes of a manufacturing method of the semiconductor apparatus of the embodiment.

First, as shown in FIG. 3A, a semiconductor substrate (semiconductor wafer) 2 is prepared, and the first insulation layer 4 is formed on the first main surface 2a by CVD (Chemical Vapor Deposition) method, spin coat method, or spray coat method and so on. Next, the first conductive layer 5 is formed on the first insulation layer 4, by sputtering method, CVD method, vacuum evaporation method, or plating method and so on. As mentioned above, the first insulation layer 4 can be constructed from silicon oxide ($SiO_2$) and so on. The first conductive layer 5 can be constructed from metal materials of Ti and so on. As mentioned above, the first conductive layer 5 can be a single layer or multi-layered structure.

Next, the through hole 3 is formed by etching the semiconductor substrate 2 to make the first insulation layer 4 exposed from the second main surface 2b side by plasma etching method using a mask of a predetermined pattern. The through hole 3 can have a constant diameter in the direction of the depth and its inner wall is almost perpendicular. The through hole 3 can have a taper toward the first insulation layer 4.

During the forming of the through hole 3, plasma etching is used by introducing etching gas in plasma so that the semiconductor substrate 2 is etched relatively more largely compared with the first insulation layer 4. As the etching gas, for example, the mixture of $SF_6$, $O_2$, and Ar is used if a semiconductor substrate 2 is silicon (Si) and the first insulation layer 4 is $SiO_2$ film.

Figure 3B:
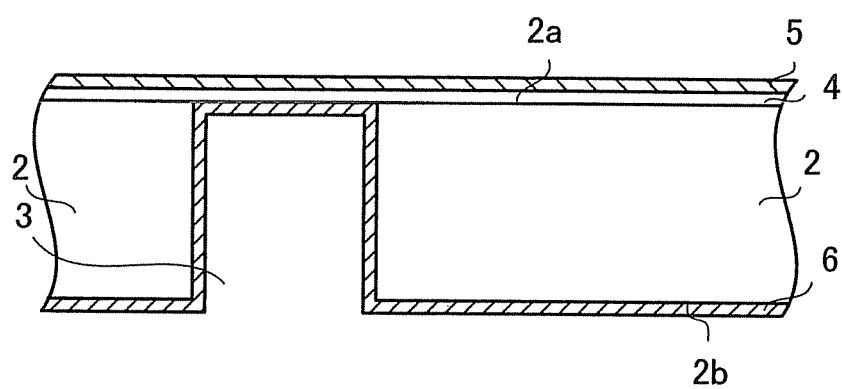

Next, as shown in FIG. 3B, the second insulation layer 6 is formed by CVD method, spray coat method, spin coat method, or film laminate method and so on so that the second insulation layer 6 covers the region from the bottom and the inner wall surface of the through hole 3 to the second main surface 2b of the semiconductor substrate 2. As mentioned above, as the second insulation layer 6, for example, silicon oxide and so on, or resin material of polyimide resin and so on can be used.

Figure 3C:
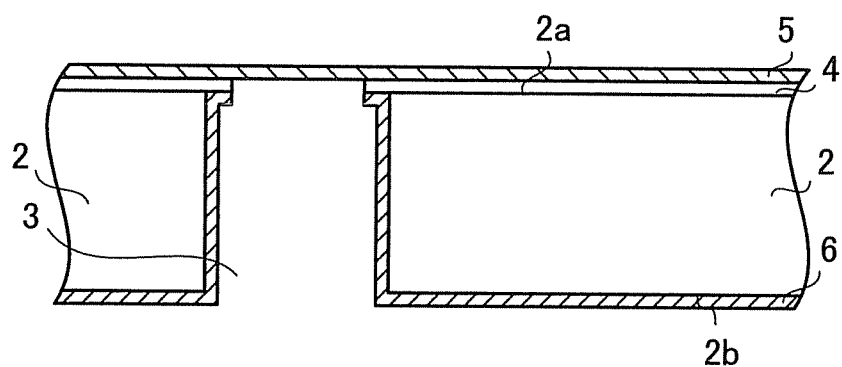

Next, as shown in FIG. 3C, using a mask of a predetermined pattern (not shown), by plasma etching, the second insulation layer 6 on the bottom of the through hole 3 is removed, and the first insulation layer 4 is exposed. Then, the first insulation layer 4 exposed in the through hole 3 is etched to be removed by the similar way, the first conductive layer 5 is exposed in the through hole 3. Besides, the second insulation layer 6 can be removed by $O_2$ plasma ashing if the second insulation layer 6 is constructed from resin of polyimide resin and so on. The second insulation layer 6 can be removed by light exposure and development if the second insulation layer 6 is constructed from a photosensitive material.

When the first insulation layer 4 exposed in the through hole 3 is removed by etching, etching gas (for example, mixture of $C_5F_8$, $O_2$, and Ar, if insulation layer 4 is constructed from $SiO_2$ film and the first conductive layer 5 is constructed from TiN, or Al) is introduced in plasma for plasma etching so that the first insulation layer 4 is etched relatively more largely compared with the first conductive layer 5.

Figure 3D:
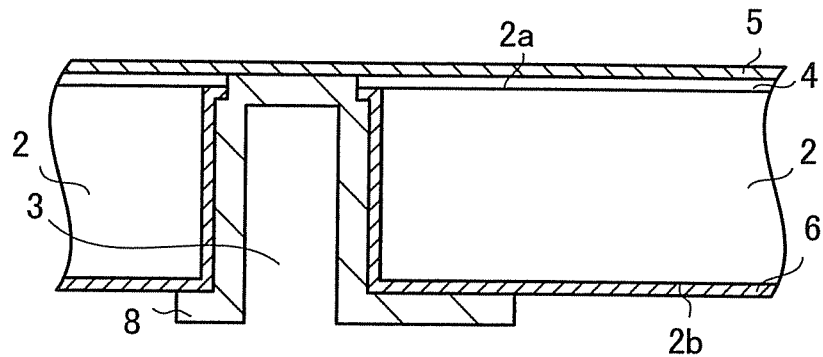

Next, as shown in FIG. 3D, the second conductive layer 8 is formed in the through hole 3. The second conductive layer 8, which is contacted to the first conductive layer 5, on the second insulation layer 6, is arranged continuously from on the inner wall of the through hole 3 to on a second main surface 2b of the semiconductor substrate 2. The second conductive layer 8 is formed in the through hole 3 and on the back surface of the semiconductor substrate 2 by sputtering method, CVD method, vacuum evaporation method, plating method, or printing method and so on, using a mask of a predetermined pattern (not shown) so as to have a conformal form and a almost uniform thickness without filling the through hole 3.

Figure 3E:
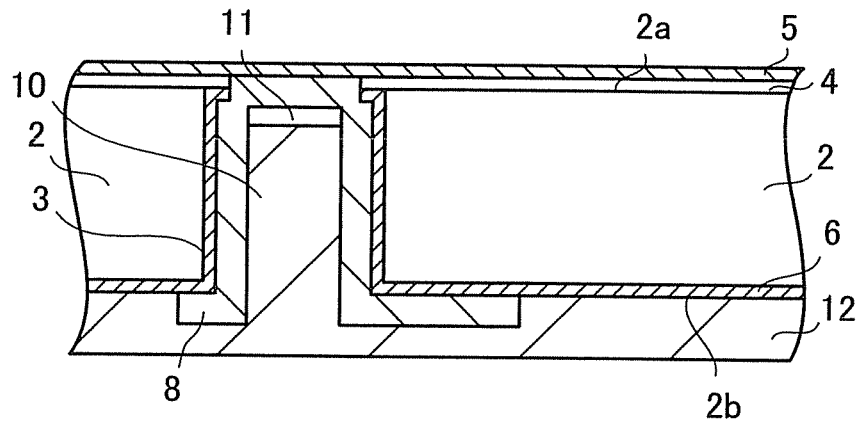

Next, as shown by FIG. 3E, the through hole 3 is filled with the filling member 10 throughout the second insulation layer 6 and the second conductive layer 8, with the gap 11 existing in the through hole 3, at the edge portion of the semiconductor substrate 2 on the side of the first main surface 2a. The filling member 10 is constructed by insulation material. Thus, the protection layer 12 can be also formed, by forming the filling member 10 extending along in through hole 3 and on the second main surface 2a of the semiconductor substrate 2 when the through hole 3 is filled by the filling member 10. In other words, the filling member 10 in the through hole 3 and the protection layer 12 are formed together.

Further, as mentioned above, the gap 11 is formed by using the thermal shrinkage during the heat curing of the filling member 10, by constructing the second conductive layer 8 from good mold-releasing conductive material, for example, Cu and so on as, or by applying good repellent material, for example, polytetrafluoroethylene on the bottom 8a of the second conductive layer 8. And, these methods can be used together.

Moreover, as mentioned above, the gap 11 can be formed so that the bottom 10a of the filling member 10 does not touch the bottom 8a of the second conductive layer 8 at all, or the bottom 10a of the filling member 10 and a part of the bottom 8a of the second conductive layer 8 does not touch. Furthermore, the gap 11 can be formed not only between the bottom 10a of the filling member 10 and the bottom 8a of the second conductive layer 8, but also between the side 10b of the filling member 10 and the side 8b of the second conductive layer 8.

Figure 3F:
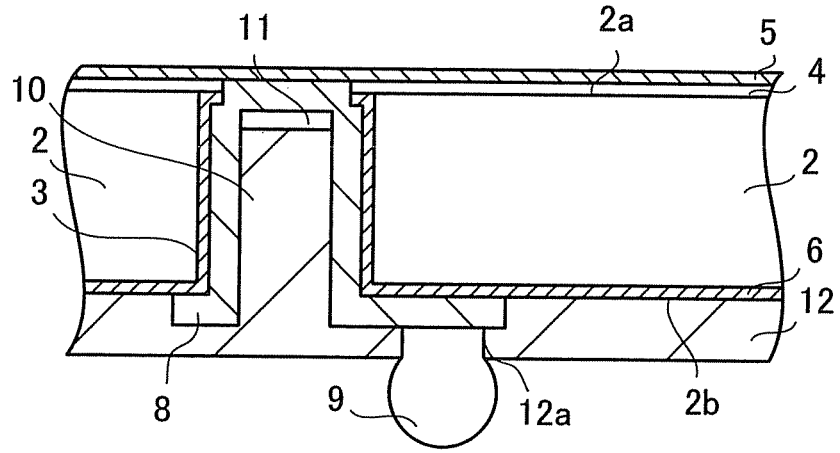

Next, as shown in FIG. 3F, the opening 12a is formed on the protection layer 12, the external terminal 9 which is constructed from solder material and so on is formed so that the external terminal 9 touches the second conductive layer 8. After that, a semiconductor substrate 2 is cut by a cutting blade of a dicer to separate into chips.

As mentioned above, the semiconductor apparatus 1 shown in FIG. 1 can be manufactured.

(A Camera Module)

Figure 4:
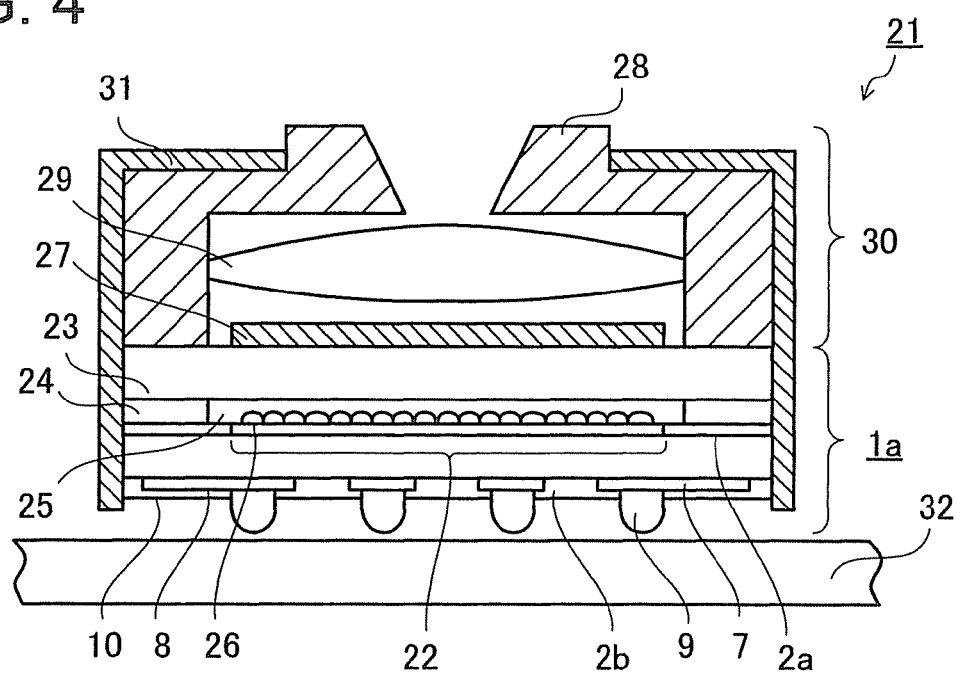
FIG. 4 is a cross section showing an outline configuration of a camera module of an embodiment.

Next, a camera module of the embodiment will be explained. FIG. 4 is a cross section showing a conceptual construction of the camera module of the embodiment.

The camera module 21 shown in FIG. 4 has a package configuration of BGA (Ball Grid Array) type, and includes the sensor module 1a consisting of the semiconductor apparatus 1 of aforementioned embodiment, a lens module 30 described as follows.

An active region of the first main surface 2a of the semiconductor substrate 2 constructing the sensor module 1a provides light receiving unit (for example CCD type image pickup device or CMOS type image pickup device and so on) 22 having a light receiving element of a photo diode and so on. Besides, the other construction is as the same as the construction explained in aforementioned embodiment. However, Figures are simplified in the embodiment, descriptions of the through hole 3 and so on is omitted.

The lens module 30 has a light transparent protection member 23 for protecting the light receiving unit 22 formed on the semiconductor substrate 2 against scratching and dust. The light transparent protection member 23 is arranged so as to be separated from the semiconductor substrate 2, and so as to cover the first main surface 2a. And, light transparent protection member 23 is attached and fixed to the semiconductor substrate 2, via the attachment layer 24 arranged periphery regions of the first main surface 2a of the semiconductor substrate 2. As a result of this, the gap 25 exists between the light transparent protection member 23 and the first main surface 2a of the semiconductor substrate 2. The gap 25 is formed based on the thickness of the attachment layer 24.

As the light transparent protection member 23, for example, glass substrate consisting of quartz glass, borosilicate glass, soda-lime glass and so on can be used. As the attachment layer 24, for example, photosensitive or non-photosensitive epoxy resin, polyimide resin, acrylic resin, silicone resin and so on can be applied.

The lens module 3 has a micro-lens 26 for light condensation which is formed on the light receiving unit 22. Note, the gap 25 does not damage light condensation effect of the micro-lens 26.

Moreover, the lens module 30 has an IR (cut) filter 27 which blocks infrared light above the light transparent protection member 23. The lens module 30 has a condensing lens 29 fixed by lens holder 28 on the filter 27. Note, FIG. 4 shows that the condensing lens 29 includes only one lens, but the condensing lens 29 can be constructed from a plurality of lenses, if necessary.

Moreover, the sensor module 1a and the lens module 30 are covered by a shield cap 31 for electrical shield or mechanical reinforcement. The shield cap 31 is constructed from, for example, aluminum, stainless steel, or Fe—Ni alloy (42-alloy and so on). The camera module 21a is constructed from these members. Note, the sensor module 1a is mounted to the substrate 32 on which wiring (not shown) is formed via the second conductive layer 8 and the external terminal 9, and electrically connected to the wiring of the substrate 32.

In the camera module 21 like this, light from an image pickup object is condensed by lens 29, and the condensed light is received by the light receiving unit 22. The light receiving unit 22 photoelectric converts the received light, and outputs the converted output into a controlling IC (not shown) formed in the active region as sensor signal. The controlling IC includes a digital signal processor, processes the sensor signal by the processor to generate data of static images or moving images, and outputs the data into substrate 32 via the second conductive layer 8 and the external terminal 9.

The substrate 32 is connected to a memory device and a display device (not shown). The data of static images or moving images is stored in the memory device, and the display device displays the images.

Also in the camera module 21 of the embodiment, the semiconductor apparatus 1 constructing the sensor module 1a has the gap 11 formed in advance. Thus, even if the filling member 10 shrinks during reflow mounting, or during heat cycle, the filling member 10 does not directly touch the bottom 8a of the second conductive layer 8 in the through hole 3. Therefore, in the case of shrinking the filling member 10, (tensile) stresses which is generated by shrinking of the filling member 10 does not acts on the first insulation film 4 and the second insulation film 6 and on the first conductive layer 5 and the second conductive layer 8.

As a result, it is not occurred that the first insulation film 4 and/or the second insulation film 6 of the sensor module 1a or the semiconductor apparatus 1 fractures, and the semiconductor apparatus 1 make an electrical short circuit. And, it can be avoid the problem that the first conductive layer 5 and/or the second conductive layer 8 fracture and a poor connection and so on is generated to increase the resistance of the semiconductor apparatus 1. Thus, electrical reliabilities of the semiconductor apparatus 1 can be developed.

The present inventions are explained based on aforementioned concrete examples. The present inventions are not limited the examples, and the present invention can be modified without going out of the scope of the present invention.

For example, in aforementioned embodiment, the external terminal 9 of the solder ball and so on is formed separately. On the other hand, the filling member 10 is formed so as to project out from through hole 3 to be able to work as an external terminal. In this case, aforementioned external terminal 9 need not to be formed in advance.

What is claimed is:

1. A semiconductor apparatus, comprising:
   a semiconductor substrate having first and second main surfaces and a through hole connecting the first and second main surfaces;
   a first insulation layer arranged on the first main surface, and having an opening corresponding to the through hole;
   a first conductive layer arranged on the first insulation layer, and covering the through hole;
   a second insulation layer arranged on an inner wall of the through hole and the second main surface;
   a second conductive layer arranged in the through hole and on the second insulation layer, the second conductive layer contacting the first conductive layer; and
   a filling member arranged on the second conductive layer in the through hole, and having a gap between a part of the filling member and a part of the second conductive layer on the first main surface side.

2. The semiconductor apparatus of claim 1,
   wherein the filling member is an insulation material, extends along in the through hole and on the second main surface of the semiconductor substrate, and covers the second insulation layer and the second conductive layer.

3. The semiconductor apparatus of claim 1,
   wherein the filling member is a conductive material, and contacts the second conductive layer on the second main surface of the semiconductor substrate.

4. The semiconductor apparatus of claim 1,
   wherein the gap is arranged on a bottom of the through hole and between a side of the filling member and a side of the through hole.

5. The semiconductor apparatus of claim 1,
   wherein the gap is arranged between a bottom of the filling member and a bottom and a side of the through hole.

6. A manufacturing method of a semiconductor apparatus, comprising:
- forming a first insulation layer on a first main surface of a semiconductor substrate;
- forming a first conductive layer on the first insulation layer;
- forming a through hole from a second main surface of the semiconductor substrate opposite to the first main surface towards the first main surface to expose the first insulation layer;
- forming a second insulation layer on an inner wall of the through hole and on the second surface;
- removing a part of the first and second insulation layers to expose the first conductive layer in the through hole;
- forming a second conductive layer in the through hole and on the second insulation layer, the second conductive layer contacting the first conductive layer; and
- forming a filling member on the second conductive layer in the through hole, the filling member having a gap between a part of the filling member and a part of the second conductive layer on the first main surface side.

7. The manufacturing method of claim 6,
wherein the filling member is a insulation material, extends along in the through hole and on the second main surface of the semiconductor substrate, and covers the second insulation layer and the second conductive layer.

8. The manufacturing method of claim 6,
wherein the filling member is a conductive material, and contacts the second conductive layer on the second main surface of the semiconductor substrate.

9. The manufacturing method of claim 6,
wherein the gap is arranged between a bottom of the filling member and a bottom of the through hole.

10. The manufacturing method of claim 6,
wherein the gap is arranged between a bottom of the filling member and a bottom of the through hole and between a side of the filling member and a side of the through hole.

11. The manufacturing method of claim 6,
wherein, in the forming the filling member, the gap is formed by shrinking the filling material.

12. The manufacturing method of claim 6,
wherein, in the forming the filling member, the gap is formed by applying mechanical force to the second conductive layer.

* * * * *